United States Patent
Mazahreh et al.

(10) Patent No.: US 7,161,995 B1
(45) Date of Patent: Jan. 9, 2007

(54) METHOD AND APPARATUS FOR VITERBI SYNCHRONIZATION

(75) Inventors: Raied N. Mazahreh, Salt Lake City, UT (US); Edwin J. Hemphill, Kaysville, UT (US); James M. Simkins, Park City, UT (US)

(73) Assignee: Xilinx, Inc., San Jose, CA (US)

( * ) Notice: Subject to any disclaimer, the term of this patent is extended or adjusted under 35 U.S.C. 154(b) by 755 days.

(21) Appl. No.: 10/098,282

(22) Filed: Mar. 15, 2002

(51) Int. Cl.
*H04B 1/66* (2006.01)

(52) U.S. Cl. .................................. 375/341; 375/262

(58) Field of Classification Search ................ 375/341, 375/340, 316, 354, 259, 260, 262
See application file for complete search history.

(56) References Cited

U.S. PATENT DOCUMENTS

| | | | | |
|---|---|---|---|---|
| 5,463,403 A | * | 10/1995 | Walker et al. | ............... 342/359 |
| 6,546,524 B1 | | 4/2003 | Chankramath et al. | |
| 2002/0191716 A1 | * | 12/2002 | Xia et al. | ................... 375/341 |
| 2003/0142728 A1 | * | 7/2003 | Lin | ............................ 375/147 |

OTHER PUBLICATIONS

Qualcomm ASIC Products; "Forward Error Correction Data Book"; 80/24128-1; Feb. 1997; Available from QUALCOMM Incorporated; pp. 1-4 through 1-22.*

* cited by examiner

*Primary Examiner*—Kevin Burd
(74) *Attorney, Agent, or Firm*—W. Eric Webostad; Kim Kanzaki

(57) ABSTRACT

Method and apparatus are described for determining when a convolution decoder is out of synchronization. Normalizations from a convolutional decoder are counted to provide a normalization count, and errors from the convolutional decoder are counted to provide an error count. One of the normalization count and the error count is compared to a first threshold associated with the selected one of the normalization count and the error count. The other of the normalization count and the error count is compared to a second threshold in response to meeting the first threshold, such as bit errors per X normalizations or normalizations per Y bit errors. From this latter comparison, an indicator is generated as to whether the convolutional decoder is synchronized or not.

28 Claims, 5 Drawing Sheets ously encoded data. For example, phase ambiguities may exist in
METHOD AND APPARATUS FOR VITERBI SYNCHRONIZATION

FIELD OF THE INVENTION

The present invention relates generally to Viterbi synchronization, and more particularly to determining when Viterbi decoded data is out of synchronization.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility and cost. An FPGA typically includes an array of configurable logic blocks (CLBs) surrounded by a ring of programmable input/output blocks (IOBs). The CLBs and IOBs are interconnected by a programmable interconnect structure. The CLBS, IOBS, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

FPGAs may be configured to provide a Viterbi decoder or to be integrated with a Viterbi decoder. Conventionally, a Viterbi decoder is used for decoding convolutionally encoded data, though a Viterbi decoder may be used with other trellis-like structured transmission schemes. Use of convolutionally encoded data and Viterbi decoding is a known form of Forward Error Correction (FEC). FEC techniques are used in communications systems to improve channel capacity. Viterbi decoding is presently a requirement for third generation (3G) wireless network base stations. However, Viterbi decoding may be used in any of a variety of other known high data rate applications, including but not limited high definition television. For example, in a high data rate application, data bits may overlap causing intersymbol interference (ISI). Data bits may overlap owing to data rate, as well as bandwidth constraints. Moreover, other noise, such as additive white Gaussian noise (AWGN), may interfere with a transmitted data signal.

In order to accurately resolve a received transmission in the presence of noise, FEC is used. Use of FEC facilitates transmission of data in a manner that allows for a lower signal-to-noise ratio (SNR), namely, increased channel capacity, while obtaining an acceptable Bit Error Rate (BER). Thus, though SNR may be relatively small, valid data may still be decoded. Notably, in digital communication systems, SNR is conventionally expressed as Eb/No, which means energy per bit divided by one-sided noise density.

Convolutional codes may be expressed in terms of code rate and constraint length. Code rate, k/n, is the number of bits, k, into a convolutional encoder divided by the number of channel symbols, n, output by the convolutional encoder in an encoder cycle. Two well-known output symbols for Viterbi decoding are I and Q, representing I and Q channels of a signal. These two channels are distinct as they are modulated on respective carrier signals of the same frequency that are orthogonal to one another. Constraint length, M, is convolutional encoder length, namely, the number of k-bit stages available as input to combinatorial logic that produces output symbols. Decisions as to k-bits received may be made with unquantized estimates of received bits (soft decision decoding) or quantized estimates of received bits (hard decision decoding). In the latter embodiment, bits are decoded to form hard decisions, analog-to-digital quantization levels, on a waveform.

An approach to higher code rates is punctured codes. Generating output symbols from a convolutional encoder and then deleting one or more selected output channel symbols creates a punctured code. Accordingly, the number of output channel symbols, n, is reduced while the number of bits, k, into a convolutional encoder is not reduced. Hence, a higher code rate may be provided with puncture codes.

A problem with Viterbi decoding occurs when a Viterbi decoder is not synchronized with received convolutionally encoded data. For example, phase ambiguities may exist in I and Q symbols when a phase lock loop (PLL) locks on a wrong phase, and thus a Viterbi decoder dependent upon such a PLL locking to a correct phase will be out of synchronization. It is important to resolve such phase ambiguities, as an unsynchronized Viterbi decoder will not produce valid data. While a 180-degree phase ambiguity or out-of-phase condition may be resolved with differential encoding and decoding, other phase ambiguities need a synchronization algorithm.

Normalization rate may be used to detect Viterbi decoder synchronization status. A high normalization rate, namely, one exceeding a determined threshold, would indicate a loss of synchronization. Though normalization rate works for all values of Eb/No, normalization rate threshold depends on code rate. As an example, the Qualcomm Q1900 Viterbi Decoder at a code rate of ½ has a normalization rate threshold of 10.2 percent. If a punctured code was used with a code rate of ¾, normalization rate threshold is 1.7 percent. A code rate of ⅞ has a normalization rate threshold of 0.8 percent. Thus, as code rate increases, margin of error decreases making achieving normalization more problematic.

BER may be used to detect Viterbi decoder synchronization status. BER is estimated by comparing Viterbi decoder decisions to channel hard decisions. A BER exceeding a predetermined threshold is used to indicate loss of synchronization of a Viterbi decoder. Though BER works for both punctured and non-punctured codes, BER threshold is dependent on Eb/No. In other words, such a BER threshold does not work for all values of Eb/No. So for example, both unsynchronized and synchronized values of Eb/No exist for such a predetermined threshold.

Accordingly, it would be desirable and useful to provide method and apparatus to detect when a Viterbi decoder is in an unsynchronized state. More particularly, it would be desirable and useful to provide method and apparatus that reduced probability of both synchronized and unsynchronized Eb/No values existing for a threshold and did not reduce margin of error as much for punctured codes.

SUMMARY OF THE INVENTION

An aspect of the present invention is a method for determining when a convolutional decoder is out of synchronization. Normalizations are counted to provide a normalization count. Errors are counted to provide an error count. One of the error count and the normalization count is compared to a first threshold therefore. The other of the error count and the normalization count is compared to a second threshold in response to meeting the first threshold, and an indicator is generated as to whether the convolutional decoder is synchronized.

Another aspect of the present invention is an apparatus for determining when a convolutional decoder is not synchronized to input data the convolutional decoder is receiving. A normalization counter is coupled to obtain normalizations from the convolutional decoder and configured to accumulatively count normalizations and to output a normalization count. A convolutional encoder is coupled to obtain output data from the convolutional decoder and configured to provide convolutional encoded output. First compare logic is coupled to obtain the convolutional encoder output from the convolutional encoder and to obtain channel output from the convolutional decoder, where the first compare logic is configured to compare the convolutional encoder output with the channel output to provide an error output. An error counter is coupled to obtain the error output and configured to accumulatively count errors and to output an error count. Second compare logic is coupled to obtain the error count and configured to compare the error count with a first threshold to provide an enable signal. A storage device is coupled to obtain the enable signal and the normalization count, the storage device configured to load the normalization count in response to the enable signal and to provide loaded normalization count output. Third compare logic is coupled to obtain the loaded normalization count output and configured to compare a second threshold and the loaded normalization count output to provide a synchronization indicator output, where the synchronization indicator output indicates whether the convolutional decoder is out of synchronization with the input data.

Another aspect of the present invention is an apparatus for determining when a convolutional decoder is not synchronized to input data the convolutional decoder is receiving. A normalization counter is coupled to obtain normalizations from the convolutional decoder and configured to accumulatively count normalizations and to output a normalization count. A convolutional encoder is coupled to obtain output data from the convolutional decoder and configured to provide convolutional encoded output. First compare logic is coupled to obtain the convolutional encoder output from the convolutional encoder and to obtain channel output from the convolutional decoder, where the first compare logic is configured to compare the convolutional encoder output with the channel output to provide an error output. An error counter is coupled to obtain the error output and configured to accumulatively count errors and to output an error count. Second compare logic is coupled to obtain the normalization count and configured to compare the normalization count with a first threshold to provide an enable signal. A storage device is coupled to obtain the enable signal and the error count, the storage device configured to load the error count in response to the enable signal and to provide loaded error count output. Third compare logic is coupled to obtain the loaded error count output and configured to compare a second threshold and the loaded error count output to provide a synchronization indicator output, where the synchronization indicator output indicates whether the convolutional decoder is out of synchronization with the input data.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
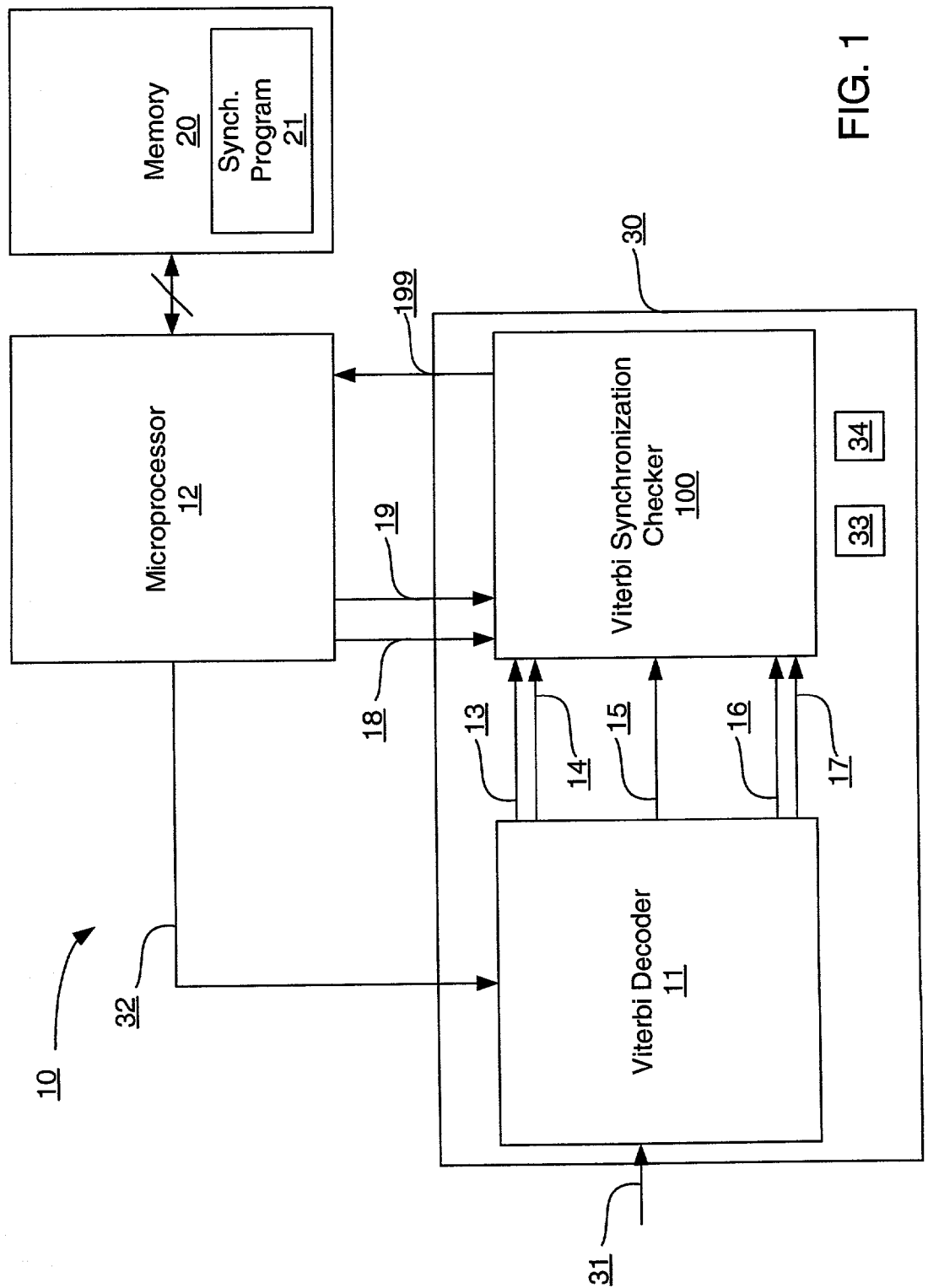
FIG. 1 is a block diagram of an exemplary embodiment of a Viterbi decoder synchronization system in accordance with one or more aspects of the present invention.

Referring to FIG. 1, there is shown a block diagram of an exemplary embodiment of a Viterbi decoder synchronization system 10 in accordance with one or more aspects of the present invention. VDS system 10 comprises microprocessor 12, memory 20 and FPGA 30. FPGA 30 may be programmed to provide Viterbi decoder 11 and Viterbi synchronization (VS) checker 100, or Viterbi decoder 11 may exist as an embedded integrated circuit or core of FPGA 30 with VS checker 100 a programmed portion of FPGA 30. Though a programmed FPGA 30 is shown, it should be appreciated that VS checker 100 and Viterbi decoder 11 may be implemented with dedicated integrated circuits, instead of a programmed FPGA 30. Moreover, it should be understood that though a microprocessor 12 is shown, a microcontroller or other central processing unit may be used. Microprocessor 12 is coupled to Viterbi decoder 11, VS checker 100 and memory 20. Memory 20 may comprise all or a portion of a synchronization program 21. As microprocessor 12, Viterbi decoder 11 and synchronization program 21 are well known, they are not described in this document in unnecessary detail in order not to obscure one or more aspects of the present invention.

Figure 2:
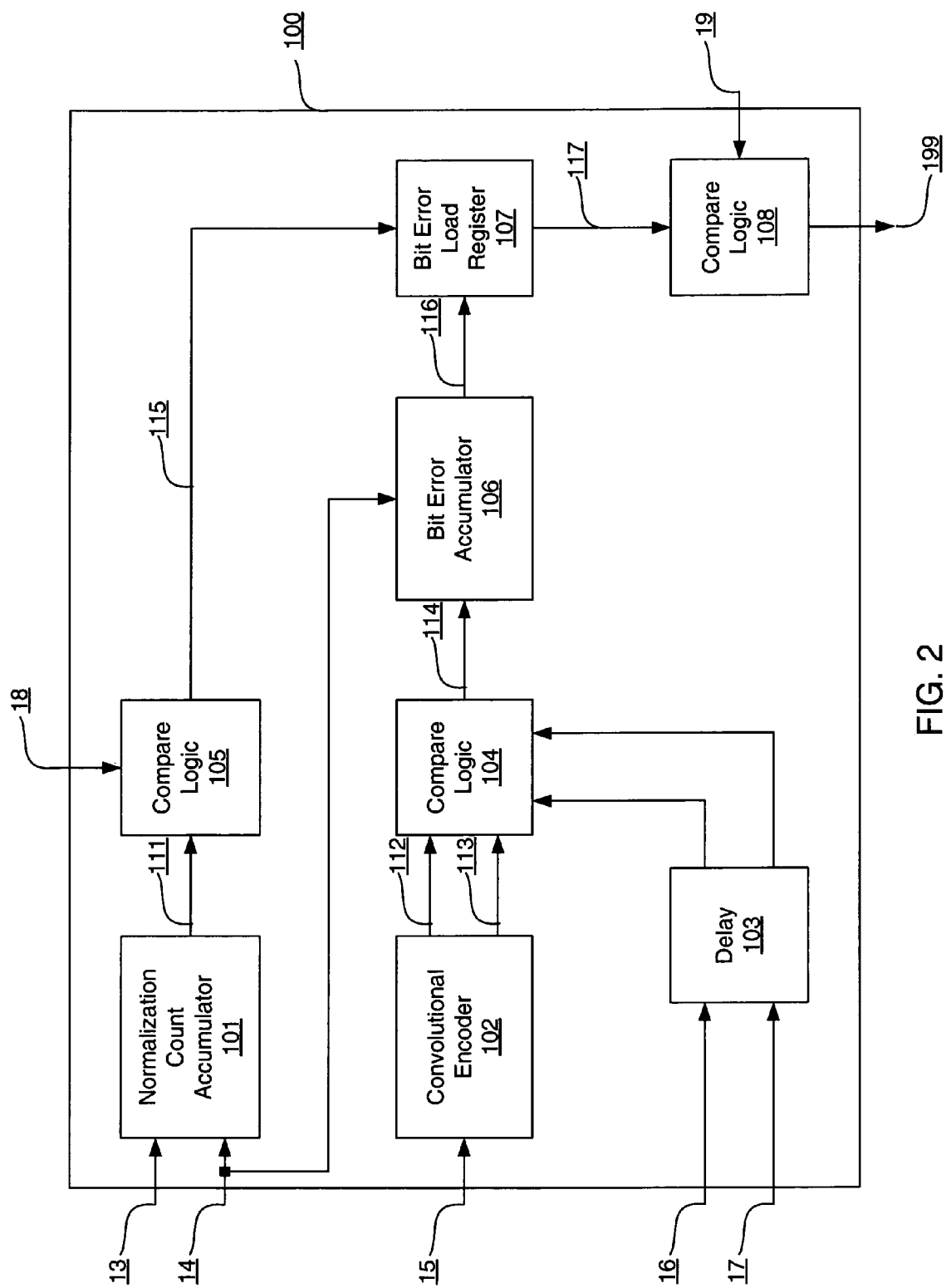
FIG. 2 is a block diagram of an exemplary embodiment of Viterbi synchronization (VS) checker in accordance with one or more aspects of the present invention.

Referring to FIG. 2, there is shown a block diagram of an exemplary embodiment of VS checker 100 in accordance with one or more aspects of the present invention. With continuing reference to FIG. 2 and renewed reference to FIG. 1, VS checker 100 receives normalize signal 13 and enable out signal 14 from Viterbi decoder 11. Enable out signal 14 is provided to normalization count accumulator 101, such as a counter, to enable it. Once enabled, normalization count accumulator 101 will count normalizations received from Viterbi decoder 11 via normalize signal 13. An amount, such as a total of normalizations, is output from normalization count accumulator 101 as normalization count signal 111.

Normalization count signal 111 is provided to compare logic 105 to determine if a threshold, such as from threshold signal 18 from microprocessor 12, is equal to, or greater than depending on implementation, counted normalizations. When such a threshold is met or exceeded, depending on implementation, a load signal 115 goes from a logic low state to a logic high state, such as from a 0 to a 1. Alternatively, if such a threshold is known in advance, then it may be stored, such as in memory or a register 33 of FPGA 30, and FPGA 30 may be configured such that signal 18 is provided from memory or register 33 to compare logic 105.

VS check 100 receives data out signal 15 from Viterbi decoder 11. Data output from Viterbi decoder 11 may be from a trace back portion of such decoder. In other words, data out signal 15 may comprise trace back data output. Data received from Viterbi decoder 11 via data out signal 15 is provided to convolutional encoder 102. Convolutional encoder 102 encodes data from data out signal 15 to provide two output bits as output S0 and S1 signals 112 and 113. It should be appreciated that while convolutional encoder 102 encodes data, normalization count accumulator 101 is counting normalizations.

Viterbi decoding and re-encoding data from data out signal 15 takes time, and thus output S0 and S1 signals 112 and 113 are delayed by a time delay, D, with respect to channel hard decisions for I and Q channels, namely, I-hard signal 16 and Q-hard signal 17, from Viterbi decoder 11. As I-hard signal 16 is to be compared with output S0 signal 112 by compare logic 104, such as a comparator, and as Q-hard signal 17 is to be compared with output S1 signal 113 by compare logic, I-hard signal 16 and Q-hard signal 17 are provided to line delay 103. Line delay delays I-hard signal 16 and Q-hard signal 17 by a time delay, D, such that I-hard signal 16, Q-hard signal 17, output S0 signal 112 and output S1 signal 113 arrive at compare logic in at least approximate synchronization for purposes of comparison to provide bit error information as bit error signal 114. Notably, for punctured codes, places where punctured data existed are ignored for this comparison. Moreover, bit comparison or symbol comparison may be done by compare logic 104. However, for purposes of clarity, compare logic is described for producing a signal indicative of one or more bit errors found by such comparison, though one or more symbol errors may be substituted for bit errors.

Enable out signal 14 is provided to bit error accumulator 106 to enable it to count one or more bit errors from bit error signal 114. Bit error accumulator 106 provides a bit error count signal 116 indicating a bit error count to one or more storage elements, such as bit error load register 107. If and when load or enable signal 115 is logic high, bit error load register 107 is enabled to load a bit error count from bit error count signal 116. Effectively, by enabling bit error count or load register 107 in response to a threshold value of normalizations being met, a loaded bit error count in response to such enabling is effectively divided by or per such a threshold value or number of normalizations. Though load register 107 may be implemented with a register, other well-known storage devices may be used, including, but not limited to, memory.

Once a bit error count has been loaded into register 107 in response to load signal 115, or rather in response to having met a threshold count of normalizations, such a count of bit errors for such a number of normalizations is provided to compare logic 108 via bit errors/normalizations signal 117. Compare logic 108 receives a threshold bit error count per normalizations from microprocessor 12 via threshold signal 19. Alternatively, if such a threshold is known in advance, then it may be stored, such as in memory or a register 34 of FPGA 30, and FPGA 30 may be configured such that signal 19 is provided from memory or register 33 to compare logic 105.

Compare logic 108 compares bit errors per normalizations from errors/normalizations signal 117 to such a threshold bit error count per normalizations from threshold signal 19. If bit errors per normalizations is equal to, or greater than depending on implementation, such a threshold bit error count per normalizations, then Viterbi decoder 11 is indicated as being out of synchronization by having out-of-synch signal 199 go from logic low to logic high, such as from a 0 to a 1.

Though bit/symbol error count divided by normalization count has been described, normalization count may be divided by bit/symbol error count. In which embodiment, threshold signal 19 indicates a threshold which when equal to, or less than depending on implementation, indicates an out of synchronization condition of Viterbi decoder 11.

Figure 3:
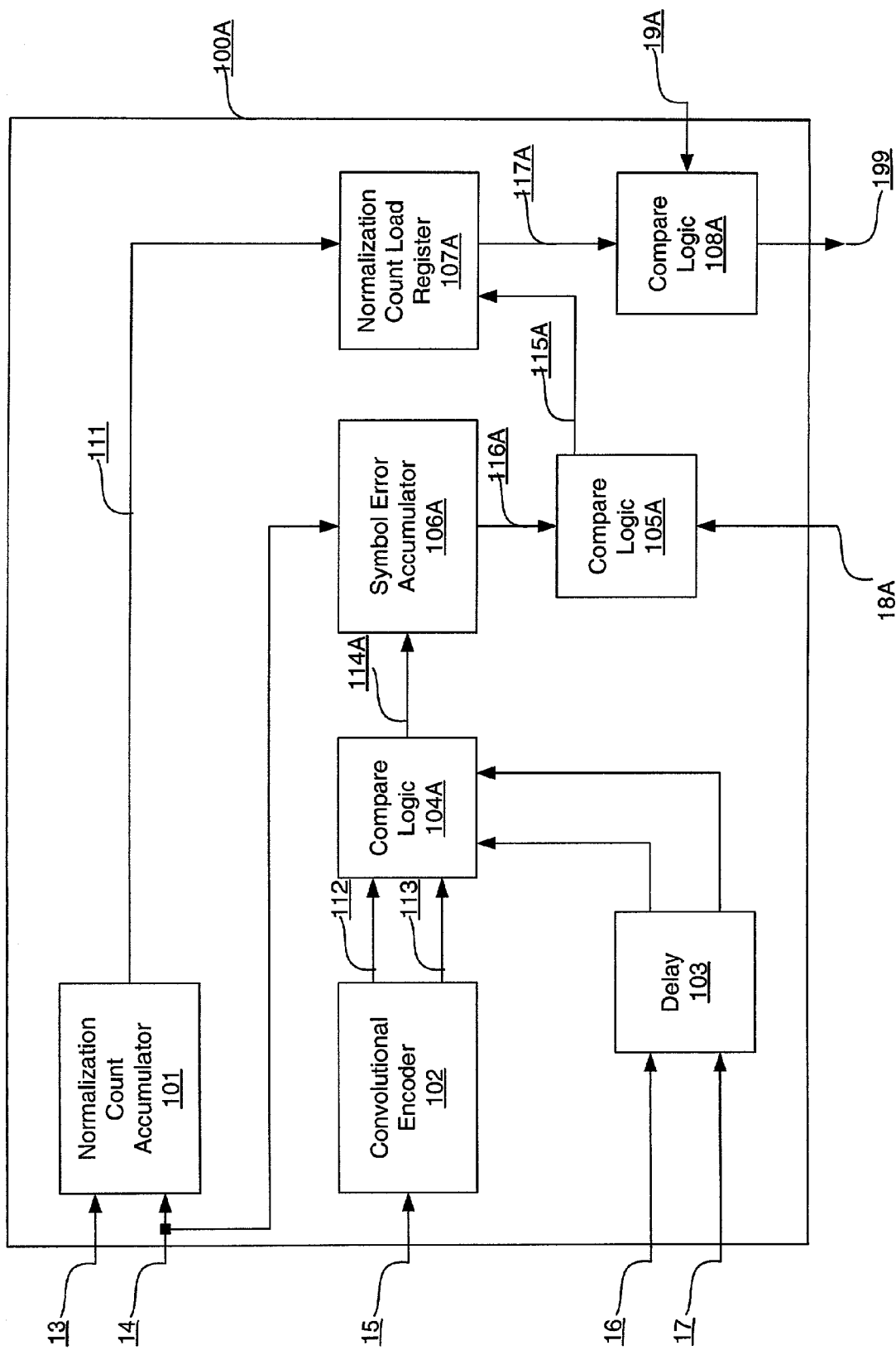
FIG. 3 is a block diagram of an exemplary alternate embodiment of a VS checker in accordance with one or more aspects of the present invention.

Moreover, bit/symbol error count may be compared to a first threshold to determine when to compare a bit/symbol error count divided by normalizations, or vise versa, to second threshold. FIG. 3 is a block diagram of an exemplary embodiment of a VS checker 100A in accordance with one or more aspects of the present invention. VS checker 100A is similar to VS checker 100 of FIG. 2. However, compare logic 104A compares symbols to provide a symbol error count via symbol error count signal 114A. Symbol error count via symbol error count signal 114A is provided to symbol error count accumulator 106A. Symbol error count accumulator provides a total of symbol errors counted to compare logic 105A via symbol error count total signal 116A. A threshold symbol error count total is provided from microprocessor 12 via threshold signal 18A to compare logic 105A for comparison with such a total of symbol errors counted. If such a threshold of symbol errors counted is exceeded, load signal 115A goes from an inactive or logic low state to an active or logic high state. Load signal 115A enables normalization count load register 107A to load a total number of normalizations accumulated at normalization count accumulator 101 via normalization count signal 111. After loading, normalization count load register 107A provides normalizations per a threshold number of symbol errors counted to compare logic 108A. Compare logic 108A receives from microprocessor 12 a threshold via threshold signal 18A for a threshold number of normalizations allowed per such a threshold number of symbol errors. If such a number of normalizations is less than, or equal to, that allowed, then Viterbi decoder 11 is indicated as being out of synchronization via out-of-synch signal 199.

Referring again to FIG. 1, microprocessor 12, in response to receiving an out-of-synch signal 199 indicating that Viterbi decoder 11 is out of synchronization, may adjust phase of Viterbi decoder 11 to synchronize with incoming data from data input signals 31a and 31b. Microprocessor 12 in response to out-of-synch signal 199 indicating that Viterbi decoder 11 is out of synchronization may invoke synchronization program 21 to produce a synchronization adjustment signal 32. Such a signal may be used to rotate I and Q symbols for synchronization of Viterbi decoder 11.

Notably, errors may be obtained using sub-optimal or optimal quantization or with soft bits and accumulated bits. Furthermore, bit errors may be obtained using sub-optimal or optimal quantization with soft bits and accumulated bits. Moreover, as mentioned above, non-punctured or punctured codes may be used, and thus viterbi decoder rate may be any of a variety of known rates Viterbi, including, but not limited to, ½, ⅔, ¾, ⅞, among others.

Figure 4:
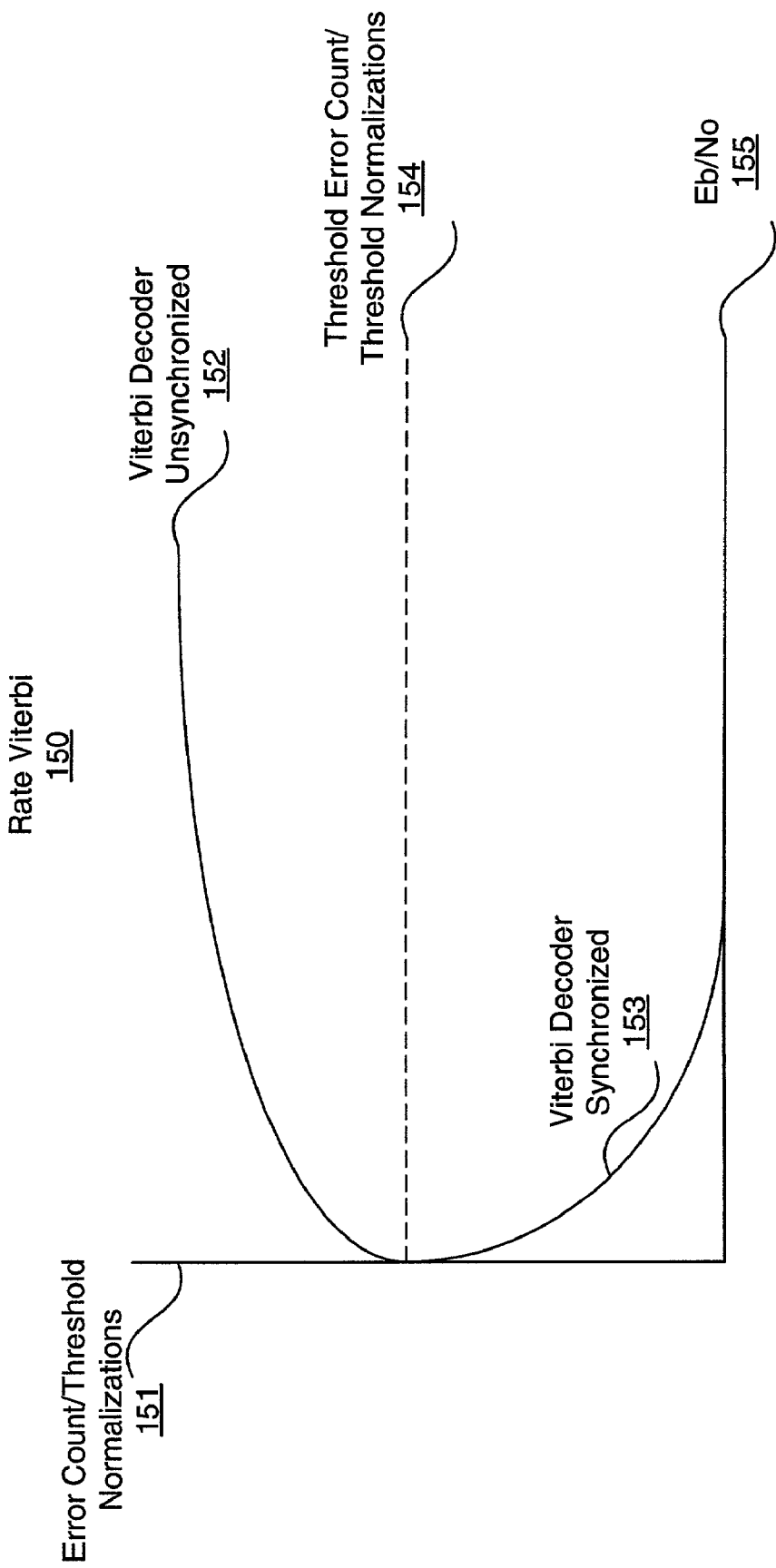
FIG. 4 is a graph of an exemplary embodiment of an Eb/No versus Error Count/Threshold Normalizations plot for a rate Viterbi in accordance with one or more aspects of the present invention.

Referring to FIG. 4, there is shown a graph of an exemplary embodiment of an Eb/No 155 versus Error Count/Threshold Normalizations 151 plot for a rate Viterbi 150 in accordance with one or more aspects of the present invention. With continuing reference to FIG. 4 and renewed reference to FIG. 2, Error Count/Threshold Normalizations 151 may be for a bit error count per a threshold number of normalizations from threshold signal 18. Notably, because values of Eb/No 155 for Viterbi decoder 11 of FIG. 1 diverge between out-of-synchronous condition 152 and synchronous condition 153, a threshold 154, such as from threshold signal 19, may be selected where values above such a threshold indicate an out-of-synchronous condition and all values below such a threshold indicate a synchronous condition for all values of Eb/No 155 for a rate Viterbi 150.

Figure 5:
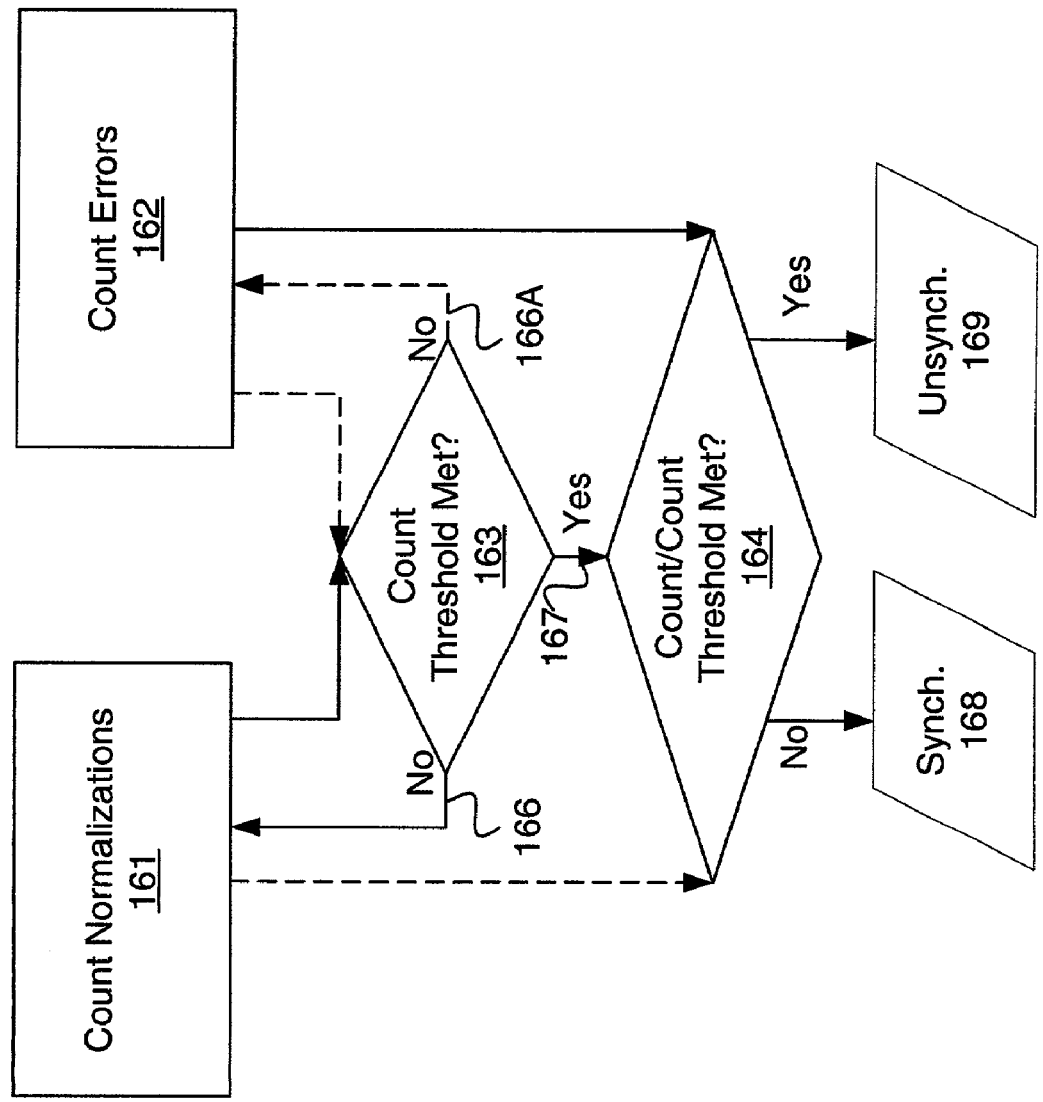
FIG. 5 is a flow diagram of a VS checker process in accordance with one or more aspects of the present invention.

Though hardware embodiments have been described, a software embodiment is equally applicable. Referring to FIG. 5, there is shown a flow diagram of a VS checker process 160 in accordance with one or more aspects of the present invention. At steps 161 and 162, respectively, normalizations and errors, symbol or bit, are counted. At step 163, a count threshold is applied to either counted normalizations or errors, as indicated with corresponding solid and dashed lines from respective steps 161 and 162, to determine whether such a count threshold has been met. Notably, counting continues at steps 161 and 162 until such a count threshold has been met, as indicated by respective "No" branches 166 and 166A.

At step 164, in response to meeting such a count threshold, as indicated by "Yes" branch 167, either errors per threshold normalizations or normalizations per threshold errors, as applicable, is compared to a selected corresponding count/count threshold where synchronous and unsynchronous conditions diverge to determine or output whether a synchronous condition 168 or an unsynchronous condition 169 exists.

While foregoing is directed to the preferred embodiment of the present invention, other and further embodiments of the invention may be devised without departing from the basic scope thereof, and the scope thereof is determined by the claims that follow. For example, normalization or error count thresholds may be any of a variety of values, including, but not limited to, 50 and 100. The actual number is not important as much as the size of the number. Larger numbers will not only take longer to accumulate slowing performance, but a convolutional decoder may be out of synchronization for a longer time before such a condition is detected owing to having to accumulate a larger number before a threshold is met. Smaller numbers may be used to reduce impact on performance and provide more rapid feedback as to convolutional decoder condition; however, smaller numbers should be large enough as to be statistically significant for the application.

All trademarks, if any, are the respective property of their owners.

What is claimed is:

1. A system for determining when a convolutional decoder is out of synchronization with input data the convolutional decoder receives, comprising:
    a microprocessor, the microprocessor configured to provide a first threshold and a second threshold;
    a synchronization checker coupled to the convolutional decoder and to the microprocessor, the synchronization checker comprising:
        a normalization counter coupled to obtain normalizations from the convolutional decoder and configured to accumulatively count normalizations and to output a normalization count;
        a convolutional encoder coupled to obtain output data from the convolutional decoder and configured to provide convolutional encoded output;
        first compare logic coupled to obtain the convolutional encoder output from the convolutional encoder and to obtain channel output from the convolutional decoder, the first compare logic configured to compare the convolutional encoder output with the channel output to provide an error output;
        an error counter coupled to obtain the error output and configured to accumulatively count errors and to output an error count;
        second compare logic coupled to obtain the normalization count and to obtain the first threshold, the second compare logic configured to compare the normalization count with the first threshold to provide an enable signal;
        a storage device coupled to obtain the enable signal and the error count, the storage device configured to load the error count in response to the enable signal and to provide loaded error count output;
        the error counter configured to provide the error count to the storage device responsive to an activation signal from the convolutional decoder, the activation signal and the normalizations from the convolutional decoder being associated, wherein the error count and the normalization count are both initiated responsive to the activation signal; and
        third compare logic coupled to obtain the second threshold and the loaded error count output, the third compare logic configured to compare the second threshold and the loaded error count output to provide a synchronization indicator output;
    wherein the synchronization indicator output indicates whether the convolutional decoder is out of synchronization with the input data.

2. The system of claim 1 wherein the synchronization checker further comprises a line delay coupled to receive the channel output and to provide a delayed version of the channel output to the first compare logic.

3. The system of claim 2 wherein the convolutional decoder is a Viterbi decoder.

4. The system of claim 2 wherein the error output is a bit error output.

5. The system of claim 2 wherein the error output is a symbol error output.

6. The system of claim 2 wherein the synchronization checker is a portion of a programmed field programmable gate array (FPGA).

7. The system of claim 6 wherein the convolutional decoder is an embedded Viterbi decoder core in the FPGA.

8. A system for determining when a convolutional decoder is out of synchronization with input data the convolutional decoder obtains, comprising:

a microprocessor, the microprocessor configured to provide a first threshold and a second threshold;

a synchronization checker coupled to the convolutional decoder and to the microprocessor, the synchronization checker comprising:

an error counter coupled to obtain errors from the convolutional decoder and configured to accumulatively count errors and to output an error count;

a convolutional encoder coupled to obtain output data from the convolutional decoder and configured to provide convolutional encoded output;

first compare logic coupled to obtain the convolutional encoder output from the convolutional encoder and to obtain channel output from the convolutional decoder, the first compare logic configured to compare the convolutional encoder output with the channel output to provide an error output;

a normalization counter coupled to obtain the normalization output and configured to accumulatively count normalizations and to output a normalization count;

second compare logic coupled to obtain the error count and to obtain the first threshold, the second compare logic configured to compare the error count with the first threshold to provide an enable signal;

a storage device coupled to obtain the enable signal and the normalization count, the storage device configured to load the normalization count in response to the enable signal and to provide loaded normalization count output;

the error counter configured to provide the error count to the storage device responsive to an activation signal from the convolutional decoder, the activation signal and the normalizations from the convolutional decoder being associated, wherein the error count and the normaliztion count are both initiated responsive to the activation signal; and third compare logic coupled to obtain the second threshold and the loaded normalization count output, the third compare logic configured to compare the second threshold and the loaded normalization count output to provide a synchronization indicator output;

wherein the synchronization indicator output indicates whether the convolutional decoder is out of synchronization with the input data.

9. The system of claim 8 wherein the synchronization checker further comprises a line delay coupled to receive the channel output and to provide a delayed version of the channel output to the first compare logic.

10. The system of claim 9 wherein the convolutional decoder is a Viterbi decoder.

11. The system of claim 9 wherein the error output is a bit error output.

12. The system of claim 9 wherein the error output is a symbol error output.

13. The system of claim 9 wherein the synchronization checker is a portion of a programmed field programmable gate array (FPGA).

14. The system of claim 13 wherein the convolutional decoder is an embedded Viterbi decoder core in the FPGA.

15. An apparatus for determining when a convolutional decoder is not synchronized to input data the convolutional decoder is receiving, comprising:

a normalization counter coupled to obtain normalizations from the convolutional decoder and configured to accumulatively count normalizations and to output a normalization count;

a convolutional encoder coupled to obtain output data from the convolutional decoder and configured to provide convolutional encoded output;

first compare logic coupled to obtain the convolutional encoder output from the convolutional encoder and to obtain channel output from the convolutional decoder, the first compare logic configured to compare the convolutional encoder output with the channel output to provide an error output;

an error counter coupled to obtain the error output and configured to accumulatively count errors and to output an error count;

second compare logic coupled to obtain the normalization count and configured to compare the normalization count with a first threshold to provide an enable signal;

a storage device coupled to obtain the enable signal and the error count, the storage device configured to load the error count in response to the enable signal and to provide loaded error count output;

the error counter configured to provide the error count to the storage device responsive to an activation signal from the convolutional decoder, the activation signal and the normalizations from the convolutional decoder being associated, wherein the error count and the normalization count are both initiated responsive to the activation signal; and third compare logic coupled to obtain the loaded error count output and configured to compare a second threshold and the loaded error count output to provide a synchronization indicator output;

wherein the synchronization indicator output indicates whether the convolutional decoder is out of synchronization with the input data.

16. The apparatus of claim 15 further comprising a line delay coupled to receive the channel output and to provide a delayed version of the channel output to the first compare logic.

17. The apparatus of claim 16 wherein the convolutional decoder is a Viterbi decoder.

18. The apparatus of claim 16 wherein the error output is a bit error output.

19. The apparatus of claim 16 wherein the error output is a symbol error output.

20. The apparatus of claim 16 wherein the synchronization checker is a portion of a programmed field programmable gate array (FPGA).

21. The apparatus of claim 20 wherein the convolutional decoder is an embedded Viterbi decoder core in the FPGA.

22. An apparatus for determining when a convolutional decoder is not synchronized to input data the convolutional decoder is receiving, comprising:

a normalization counter coupled to obtain normalizations from the convolutional decoder and configured to accumulatively count normalizations and to output a normalization count;

a convolutional encoder coupled to obtain output data from the convolutional decoder and configured to provide convolutional encoded output;

first compare logic coupled to obtain the convolutional encoder output from the convolutional encoder and to obtain channel output from the convolutional decoder, the first compare logic configured to compare the convolutional encoder output with the channel output to provide an error output;

an error counter coupled to obtain the error output and configured to accumulatively count errors and to output an error count;

second compare logic coupled to obtain the error count and configured to compare the error count with a first threshold to provide an enable signal;

a storage device coupled to obtain the enable signal and the normalization count, the storage device configured to load the normalization count in response to the enable signal and to provide loaded normalization count output;

the error counter configured to provide the error count to the storage device responsive to an activation signal from the convolutional decoder, the activation signal and the normalizations from the convolutional decoder being associated, wherein the error count and the normalization count are both initiated responsive to the activation signal; and third compare logic coupled to obtain the loaded normalization count output and configured to compare a second threshold and the loaded normalization count output to provide a synchronization indicator output;

wherein the synchronization indicator output indicates whether the convolutional decoder is out of synchronization with the input data.

23. The apparatus of claim 22 further comprising a line delay coupled to receive the channel output and to provide a delayed version of the channel output to the first compare logic.

24. The apparatus of claim 23 wherein the convolutional decoder is a Viterbi decoder.

25. The apparatus of claim 23 wherein the error output is a bit error output.

26. The apparatus of claim 23 wherein the error output is a symbol error output.

27. The apparatus of claim 23 wherein the synchronization checker is a portion of a programmed field programmable gate array (FPGA).

28. The apparatus of claim 27 wherein the convolutional decoder is an embedded Viterbi decoder core in the FPGA.

* * * * *